United States Patent
Kusaba et al.

(10) Patent No.: US 7,541,663 B2
(45) Date of Patent: Jun. 2, 2009

(54) P-TYPE SILICON WAFER AND METHOD FOR HEAT-TREATING THE SAME

(75) Inventors: Tatsumi Kusaba, Takeo (JP); Hidehiko Okuda, Imari (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/200,233

(22) Filed: Aug. 10, 2005

(65) Prior Publication Data
US 2006/0027897 A1 Feb. 9, 2006

(30) Foreign Application Priority Data
May 21, 2004 (JP) ............... 2004-152487

(51) Int. Cl.
*H01L 29/861* (2006.01)
(52) U.S. Cl. .............. 257/610; 257/E23.137; 257/E21.085
(58) Field of Classification Search ........ 257/213, 257/607, 609–612, 617, E23.137, E21.085, 257/E21.317, E21.318; 438/471, 473; 117/2
See application file for complete search history.

(56) References Cited

U.S. PATENT DOCUMENTS

| | | | |
|---|---|---|---|
| 6,544,656 B1 * | 4/2003 | Abe et al. ............... | 428/446 |
| 2001/0037761 A1 * | 11/2001 | Ries et al. ............... | 117/200 |
| 2004/0009111 A1 * | 1/2004 | Haga et al. ............. | 423/328.2 |
| 2005/0250297 A1 * | 11/2005 | Shive et al. ............ | 438/471 |

FOREIGN PATENT DOCUMENTS

WO  WO 0173838  10/2001

* cited by examiner

*Primary Examiner*—Matthew Smith
*Assistant Examiner*—Quovaunda Jefferson
(74) *Attorney, Agent, or Firm*—Pillsbury Winthrop Shaw Pittman, LLP

(57) ABSTRACT

This p-type silicon wafer was subjected to heat treatment to have a resistivity of 10 Ω·cm or more, a BMD density of $5 \times 10^7$ defects/cm$^3$ or more, and an n-type impurity concentration of $1 \times 10^{14}$ atoms/cm$^3$ or less at a depth of within 5 μm from a surface of the wafer. This method for heat-treating p-type silicon wafers, the method includes the steps of: loading p-type silicon wafers onto a wafer boat, inserting into a vertical furnace, and holding in an argon gas ambient atmosphere at a temperature of 1100 to 1300° C. for one hour; moving the wafer boat to a transfer chamber and discharging the silicon wafers; and transferring to the wafer boat silicon wafers to be heat treated next, wherein after the discharge of the heat-treated silicon wafers, the silicon wafers to be heat-treated next are transferred to the wafer boat within a waiting time of less than two hours.

6 Claims, 3 Drawing Sheets

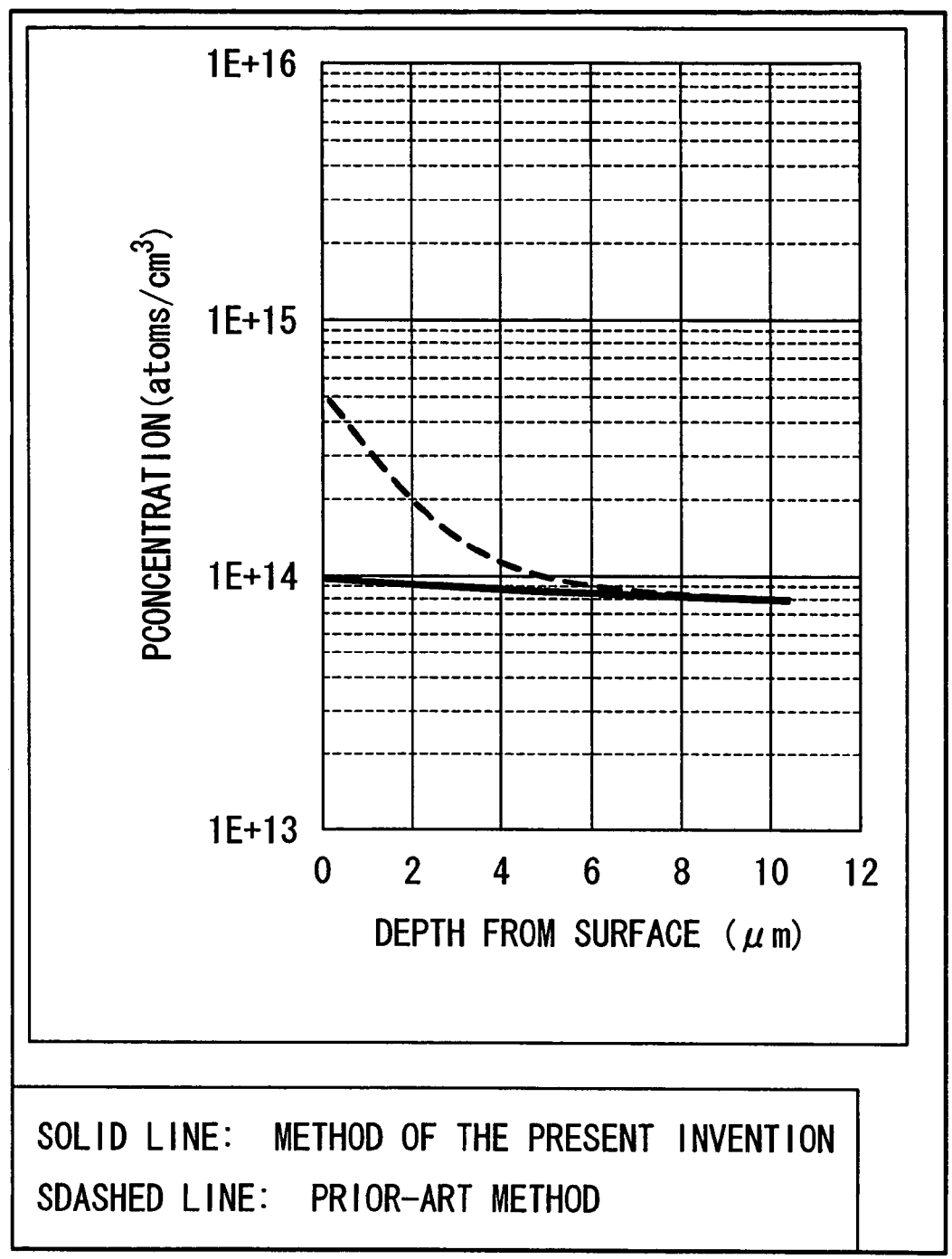

P-TYPE SILICON WAFER AND METHOD FOR HEAT-TREATING THE SAME

CROSS REFERENCE TO RELATED APPLICATIONS

This application is related to, but does not claim priority from, Japanese Patent Application No. 2004-152487, filed May 21, 2004, the contents of which are incorporated herein in their entirety by reference.

BACKGROUND OF THE INVENTION

1. Field of the Invention

The present invention relates to p-type silicon wafers and to a method for heat-treating the same. More specifically, the present invention relates to p-type silicon wafers having a high resistivity and to a method for heat-treating the same.

2. Background Art

The growing use of portable devices such as cell phones has led to an increase in the demand of p-type silicon wafers having high resistivity (at least 10 Ω·cm) for high-frequency applications. To obtain such p-type silicon wafers having high resistivity, the wafers are prepared at a low dopant concentration. In the case of p-type silicon wafers, doping is carried out using an impurity such as boron at a boron concentration of $1\times10^{15}$ atoms/cm$^3$ or less.

In p-type silicon wafers having a resistivity of at least 10 Ω·cm, the dopant concentration and the resistivity have a relationship that is almost completely inversely proportional. That is, a decrease in the p-type dopant concentration is accompanied by an increase in resistivity. In p-type silicon wafers which have high resistivity and are used in high-frequency products, it is thus important to have the resistivity in a depth direction be uniform.

A technique for achieving uniform resistivity in a near surface region of a silicon wafer in this way has been disclosed in, for example, the prior-art document cited in Patent Document 1. This patent document discloses a technique for achieving uniform resistivity at or in a vicinity of a surface of a silicon wafer by cleaning the surface with a hydrofluoric acid solution, and then carrying out heat treatment in an argon gas ambient atmosphere.

P-type silicon wafers are heat-treated to reduce defects such as crystal originated particles (COP) in a wafer preparation process, after which they are shipped out. In a vertical furnace of a vertical thermal processing apparatus used to carry out such heat treatment, there is a tendency to occur a buildup of impurities on a wafer boat in a transfer chamber. Such impurities include n-type impurities. N-type impurities are present in an ambient atmosphere of the transfer chamber and end up depositing on the wafer boat in the transfer chamber or on the surfaces of p-type silicon wafers during transfer. Moreover, the longer the wafer boat remains in the transfer chamber prior to heat treatment, the greater the tendency for p-type silicon wafers to be contaminated by n-type impurities. Hence, p-type silicon wafers are contaminated from the surface thereof by n-type impurities. Also, these n-type impurities offset the effects of the boron dopant concentration. As a result, p-type silicon wafers end up having a non-uniform resistivity in the depth direction from the surface to the bulk layer.

Patent Reference 1: Japanese re-publication of International Patent Application, Publication No. WO 01/073838.

SUMMARY OF THE INVENTION

The inventors have discovered that, in a vertical furnace, by controlling a wafer boat waiting time after which heat-treated p-type silicon wafers are discharged from a transfer chamber and which is up until silicon wafers to be heat-treated next are loaded into the transfer chamber so that this waiting time is set to be short and heat-treating p-type silicon wafers in an argon gas ambient atmosphere, there can be obtained p-type silicon wafers having a uniform resistivity in a depth direction from a surface.

It is therefore an object of the present invention to provide p-type silicon wafers which have been heat-treated in an argon gas ambient atmosphere and which have a uniform resistivity in the depth direction from the surface to the bulk layer. Another object of the present invention is to provide a method for heat-treating such p-type silicon wafers.

Accordingly, the p-type silicon wafer of the present invention was subjected to heat treatment to have a resistivity of 10 Ω·cm or more, a bulk microdefect (BMD) density of $5\times10^7$ defects/cm$^3$ or more, and an n-type impurity concentration of $1\times10^{14}$ atoms/cm$^3$ or less at a depth of within 5 μm from a surface of the wafer.

The p-type silicon wafer of the present invention has been heat-treated in an ambient gas such as argon gas, thereby the BMD density is set to $5\times10^7$ defects/cm$^3$ or more and the resistivity in the depth direction from the surface to the bulk layer is made to be uniform.

This p-type silicon wafer is doped with, for example, $1\times10^{15}$ atoms/cm$^3$ or less of p-type dopants such as boron. P-type silicon wafers having a resistivity of 10 Ω·cm or more can be used in high-frequency product applications.

N-type impurities deposit onto the surface of the p-type silicon wafer for some reason or other. The N-type impurities present in this p-type silicon wafer include at least one Group 5B element such as phosphorus or arsenic. When a p-type silicon wafer on a surface of which n-type impurities have deposited is heat-treated in an ambient gas such as argon gas, effects of the p-type (boron) dopant concentration are offset, changing a surface resistivity.

To keep from compromising characteristics of high-resistivity silicon wafers intended for high-frequency device applications, it is necessary for the n-type impurity concentration from the surface of the p-type silicon wafer to be $1\times10^{14}$ atoms/cm$^3$ or less. Generally, such N-type impurity contamination in annealed silicon wafers arises at a depth of within 5 μm from the surface of the wafer. When the n-type impurity concentration exceeds $1\times10^{14}$ atoms/cm$^3$, the characteristics will vary depending on the device to be formed, making it impossible to achieve the target device characteristics.

In the p-type silicon wafer of the present invention, the n-type impurity may be at least one from among phosphorus and arsenic.

Also, the heat treatment may be carried out in an argon gas ambient atmosphere at a temperature of 1100 to 1300° C. for one hour.

The heat treatment is carried out using, for example, a vertical furnace. This heat treatment in the argon gas ambient atmosphere enables crystal originated particles (COP) at or in a vicinity of the surface of the silicon wafer to be reduced. Moreover, carrying out such heat treatment enables the n-type impurity concentration at a depth of within 5 μm from a surface of the wafer to be held to $1\times10^{14}$ atoms/cm$^3$ or less, which has previously been impossible in silicon wafer preparation. Therefore, p-type silicon wafers having a uniform resistivity in the depth direction from the surface can be obtained.

At a heat treatment temperature of less than 1100° C., it is difficult to achieve improvement effects such as a reduction in COPs in the surface of the silicon wafer after annealing. On the other hand, at more than 1300° C., slips tend to arise.

The method for heat-treating p-type silicon wafers of the present invention includes the steps of: loading p-type silicon wafers having a resistivity of 10 Ω·cm or more onto a wafer boat, inserting the loaded wafer boat into a vertical furnace, and holding the silicon wafers in an argon gas ambient atmosphere at a temperature of 1100 to 1300° C. for one hour; moving the wafer boat to a transfer chamber and discharging the heat-treated silicon wafers from the wafer boat; and transferring to the wafer boat silicon wafers to be heat treated next, wherein defining a length of time from a moment when the heat-treated silicon wafers are discharged from the wafer boat in the transfer chamber to a moment when the silicon wafers to be heat treated next are transferred to the wafer boat as a waiting time during which the wafer boat waits in the transfer chamber, the waiting time is set to be less than two hours.

In the method for heat-treating p-type silicon wafers of the present invention, heat treatment using a vertical furnace is carried out as described below. First, about 100 p-type silicon wafers are transferred from a wafer container situated outside the vertical thermal processing apparatus to a wafer boat disposed in a transfer chamber which communicates with the vertical furnace. Next, the wafer boat to which the p-type silicon wafers are transferred is moved into the vertical furnace. In the vertical furnace, the p-type silicon wafers that have been loaded onto the wafer boat are heat-treated in an argon gas ambient atmosphere by being held for one hour at a temperature of 1100 to 1300° C. After this heat treatment, the wafer boat is taken out of the furnace and into the transfer chamber. And then, the wafer boat is cooled in the transfer chamber. After cooling, the p-type silicon wafers are transferred from the wafer boat to a wafer container, and the wafer container is carried out of the transfer chamber, thereby completing the heat treatment operations.

We have conducted various investigations, as a result of which we have discovered that the wafer boat tends to be easily contaminated by n-type impurities in the transfer chamber that communicates with the vertical furnace, and that the p-type silicon wafers loaded onto the wafer boat also tend to be easily contaminated by n-type impurities.

We thus investigated the waiting time during which the wafer boat waits in the transfer chamber after the heat-treated p-type silicon wafers are discharged from the transfer chamber and until the p-type silicon wafers to be treated next are transferred to the wafer boat. Based on the results of those investigations, we have set this waiting time to less than two hours. This helps discourage contamination of the wafer boat by n-type impurities in the transfer chamber. As a result, there can be obtained p-type silicon wafers which, after annealing, have a high gettering ability and a highly crystalline (COP-free) surface, and there can also be obtained high-resistivity p-type silicon wafers suitable for high-frequency device applications. The waiting time can be set to less than two hours by means of control using a timer or the like in the transfer chamber. Alternatively, process-based control may be used. For example, effective methods include shortening the transfer time by using a high-throughput wafer transfer unit, and storing the wafer boat in the furnace in the case in which a wafer non-processing period extends for one hour or more.

In this present invention, p-type silicon wafers which are doped with boron impurities are heat-treated in an argon gas ambient atmosphere. Heat treatment at this time is carried out by holding the temperature at 1100 to 1300° C. for one hour. When such treatment is administered, contamination by n-type impurities is not observed at a depth of within 5 μm from the surface of the wafer. Even in assessments of the impurity concentration in the surface of the p-type silicon wafer, the concentration of n-type impurities is $1\times10^{14}$ atoms/cm$^3$ or less. In a specific wafer preparation process, the heat-treated p-type silicon wafers are discharged from the wafer boat in the transfer chamber. The length of time during which the wafer boat then waits in the transfer chamber until p-type silicon wafers to be heat-treated are brought into the chamber is set to less than two hours. In this way, there can be obtained p-type silicon wafers which have a uniform resistivity in the depth direction from the surface to the bulk layer.

BRIEF DESCRIPTION OF THE DRAWINGS

FIG. 4 is a graph showing a relationship between a depth position from a surface of a p-type silicon wafer and a phosphorus concentration according to an embodiment of the present invention.

PREFERRED EMBODIMENTS

An embodiment of the present invention is described below in conjunction with attached FIGS. 1 to 4.

Processing steps for a p-type silicon wafer 11 are described.

First, as indicated in FIG. 1(a), silicon wafers 11 sliced from a silicon ingot grown by the Czochralski (CZ) method are prepared. This silicon wafers 11 are doped with boron (concentration, $1\times10^{15}$ atoms/cm$^3$).

Next, as indicated in FIG. 1(b), peripheral edges of the sliced p-type silicon wafers 11 are ground to a given shape using an edge-grinding wheel in an edge grinding step. This step imparts the peripheral edge of the p-type silicon wafer 11 with a cross-sectional shape having a specific roundness.

Then, as indicated in FIG. 1(c), the edge-ground wafers are lapped on a lapping machine in a lapping step.

Next, in an etching step indicated in FIG. 1(d), the lapped wafers are immersed in a given etchant (mixed acid or alkali+mixed acid) to remove strain during the lapping step and strain from the edge grinding step and other steps. Generally, about 20 μm is removed from one side and about 40 μm is removed from both sides.

As indicated in FIG. 1(e), if necessary, the p-type silicon wafers 11 are then subjected to a donor-killer thermal processing step.

Then, as indicated in FIG. 1(f), surfaces of these p-type silicon wafers 11 are mirror-polished.

Next, a cleaning step indicated in FIG. 1(g) is carried out. The cleaning step is a RCA cleaning operation which includes SC1 cleaning and SC2 cleaning. In the SC1 cleaning, a mixture of an aqueous ammonia (NH$_4$OH) solution, an aqueous hydrogen peroxide ($H_2O_2$) solution and water ($H_2O$) is used. The SC1 cleaning removes organic matter (particles) from the surface of the p-type silicon wafers 11.

Cleaning solution used in the SC2 cleaning is a mixture of an aqueous hydrochloric acid (HCl) solution, an aqueous hydrogen peroxide ($H_2O_2$) solution and water ($H_2O$). The SC2 cleaning removes metal impurities in the surface of the p-type silicon wafers 11. Processing of the p-type silicon wafer 11 is then completed.

Figure 1:
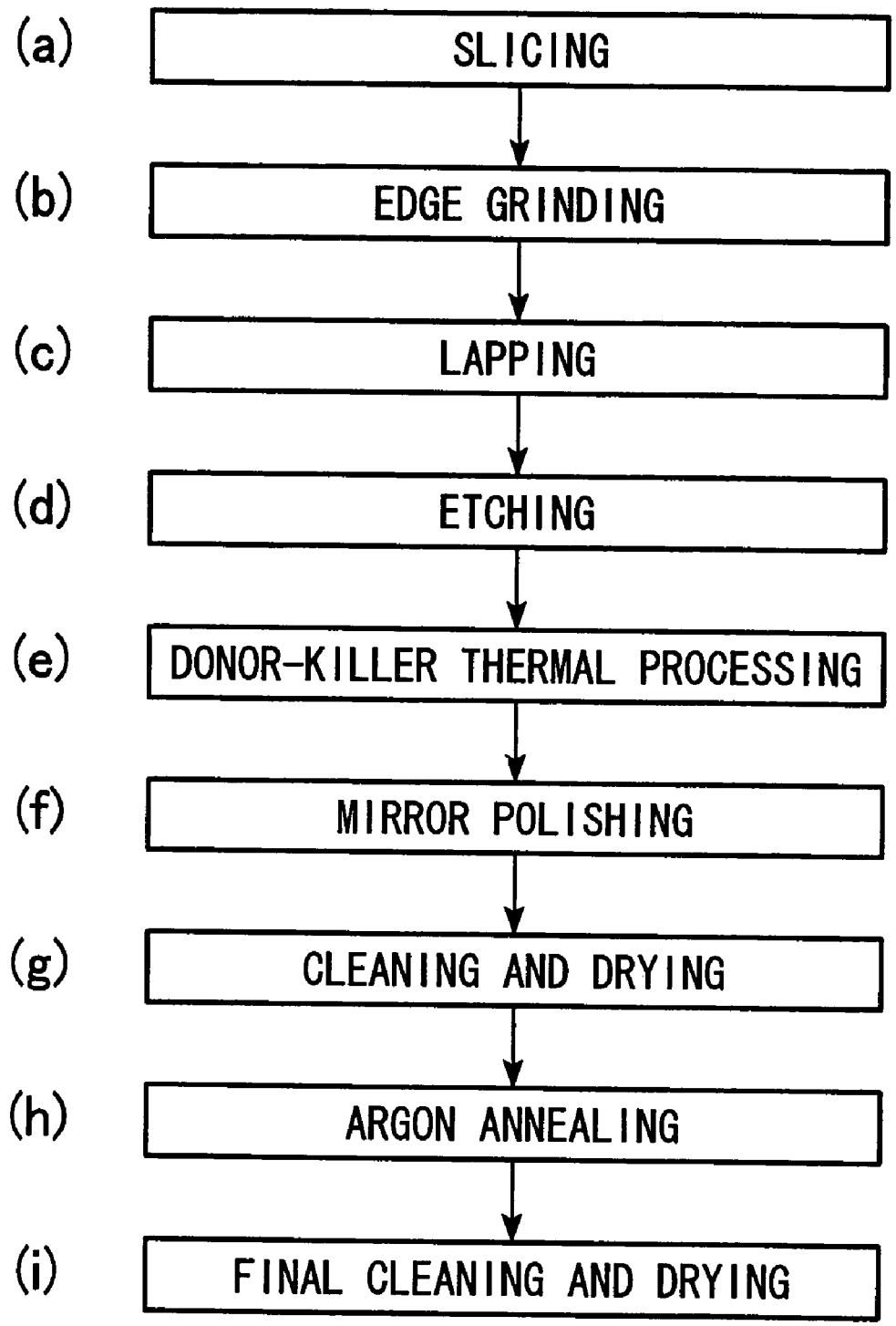
FIG. 1 is a process diagram showing a flow of p-type silicon wafer preparation steps according to an embodiment of the present invention.

In addition, as indicated in FIG. 1(*h*), the p-type silicon wafers 11 are heat-treated in an argon gas ambient atmosphere (argon annealing).

Heat treatment steps are described below in detail.

Last of all, as indicated in FIG. 1(*i*), cleaning and drying are carried out, thereby completing the p-type silicon wafers.

Figure 2:
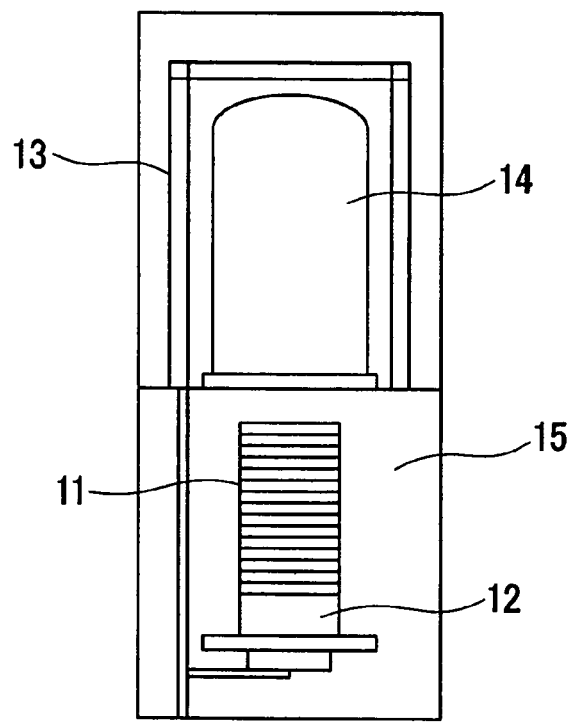
FIG. 2 is a front view showing a construction of a vertical thermal processing apparatus for carrying out heat treatment of p-type silicon wafers according to an embodiment of the present invention.

FIG. 2 shows an overall construction of a vertical thermal processing apparatus for carrying out heat treatment. This is a conventional vertical thermal processing apparatus. The vertical thermal processing apparatus used in the present invention has a heater 13 which serves as a heating means, and has at an interior thereof a substantially cylindrical process tube 14 (vertical furnace). The process tube 14 is made of quartz glass. Below the process tube 14, there is disposed a transfer chamber 15 which communicates with the process tube 14. In addition, there is disposed a vertical wafer boat 12 for horizontally holding and loading approximately 100 silicon wafers. This wafer boat 12 is provided in such a way as to load from the transfer chamber 15 into the process tube 14.

Next, a method for heat treating the p-type silicon wafer 11 is described.

As shown in FIG. 1, first a plurality of p-type silicon wafers 11 (approximately 100) are transferred to the wafer boat 12 in the transfer chamber 15. Next, the wafer boat 12 to which the p-type silicon wafers 11 are transferred is loaded into the process tube 14. In this process tube 14, the p-type silicon wafers 11 are heat-treated in an argon gas ambient atmosphere by holding the temperature at 1100 to 1300° C. for one hour.

Next, the wafer boat 12 is removed from the process tube 14 to the transfer chamber 15. Then the wafer boat 12 is cooled to a room temperature in the transfer chamber 15. After cooling, the p-type silicon wafers 11 are removed outside of the transfer chamber 15, thereby completing the heat treatment step. Next, the wafer boat 12 is made to wait in the transfer chamber 15 until the p-type silicon wafers 11 to be heat-treated next are loaded. The period of time from the moment when the p-type silicon wafers 11 that have been heat-treated are discharged from the wafer boat 12 until the moment when the p-type silicon wafers 11 to be heat-treated next are loaded into the wafer boat 12 is defined as the waiting time.

It has been confirmed that, during waiting in the transfer chamber 15, the p-type silicon wafers 11 are contaminated with n-type impurities.

Figure 3:
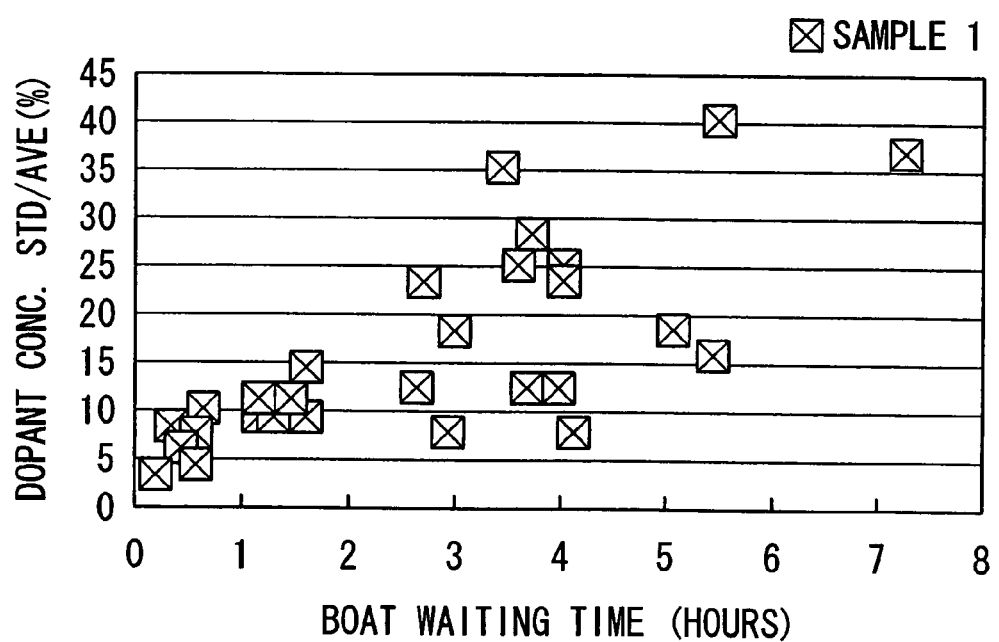
FIG. 3 is a graph showing a relationship between a wafer boat waiting time and a variance in dopant concentration (boron) according to an embodiment of the present invention.

FIG. 3 is a graph showing a relationship between the waiting time for the wafer boat 12 during which the wafer boat 12 is made to wait in the transfer chamber 15 after the heat-treated p-type silicon wafers 11 are removed and until the p-type silicon wafers 11 to be heat-treated next are loaded into the wafer boat 12, and the variance in the dopant concentration (boron) in the surface of the p-type silicon wafers 11. N-type impurities accumulate on the wafer boat 12 during waiting in the transfer chamber 1, and contaminate an atmosphere in the process chamber 1. Moreover, during the heat treatment in the process tube 14, n-type impurities diffuse to the surface of the p-type silicon wafers 11 loaded in such an atmosphere. From the graph in FIG. 3, it is apparent that the variance in the dopant concentration becomes pronounced with the passage of time. Moreover, the longer the waiting time in the transfer chamber 15, the greater the tendency for the p-type silicon wafers 11 to be contaminated by n-type impurities.

In order to overcome this problem, when the heat treatment is carried out in an argon gas ambient atmosphere, it is necessary for the wafer boat 12 waiting time in the transfer chamber 15 prior to the heat treatment to be made short and for the heat treatment to be carried out quickly.

Hence, the waiting time during which the wafer boat 12 waits in the transfer chamber 15 is controlled. From the results in the graph shown in FIG. 3, in order to hold down the variance in dopant concentration to 15% or less, the waiting time during which the wafer boat 12 waits in the transfer chamber 15 is set to less than two hours. This waiting time is controlled to less than two hours by, for example, providing a timer in the transfer chamber 15.

By carrying out the above-described heat treatment while controlling the waiting time during which the wafer boat 12 waits in the transfer chamber 15 to less than two hours, there can be obtained a p-type silicon wafer 11 having an n-type impurity concentration of $1\times10^{14}$ atoms/cm$^2$ or less at a depth of within 5 μm from the surface. Moreover, p-type silicon wafers 11 in which there is no drop in boron due to outward diffusion can be obtained. In addition, these p-type silicon wafers 11 have a BMD density of $5\times10^7$ defects/cm$^3$ or more. As a result, there can be obtained annealed p-type silicon wafers 11 having a uniform resistivity in a surface layer portion and in a bulk layer.

Next, results of an experiment conducted on the heat treatment of p-type silicon wafers 11 in an argon gas ambient atmosphere according to the present invention are reported.

Phosphorus concentration in the depth direction from the surface of p-type silicon wafers 11 prepared by the above steps (a) to (i) in FIG. 1 was measured. Here, the above heat treatment was carried out while a waiting time during which the wafer boat 12 was made to wait in the transfer chamber 15 was set less than two hours.

In addition, as a prior-art example, the phosphorus concentration in p-type silicon wafers 11 that were heat-treated in the argon gas ambient atmosphere (step (h) in FIG. 1) after a waiting time of more than two hours was measured at the same time. Those results are shown in the graph in FIG. 4.

As is apparent from the above experimental results, when p-type silicon wafers 11 are heat-treated in an argon gas ambient atmosphere by being held at a temperature of 1100 to 1300° C. for one hour, phosphorus contamination is not observed within 5 μm from the surface of the p-type silicon wafers 11. Hence, it was confirmed that p-type silicon wafers 11 having a uniform p-type dopant concentration from the surface to the bulk layer can be obtained.

Preferred embodiments of the present invention have been described above, although these embodiments are to be considered in all respects as illustrative and not limitative. Those skilled in the art will appreciate that various additions, omissions, substitutions and other modifications are possible without departing from the spirit and scope of the present invention as disclosed in the accompanying claims.

What is claimed is:

1. A p-type annealed silicon wafer having a resistivity of 10 Ω·cm or more, the annealed wafer comprising:
   p-type dopants at a concentration of $1\times10^{15}$ atoms/cm$^3$ or less; and
   n-type impurities which are at least one of phosphorus or arsenic at a concentration being $8\times10^{13}$ to $1\times10^{14}$ atoms/cm$^3$ at a depth of within 5 μm from a surface of the wafer, wherein the annealed wafer is subjected to heat treatment to achieve a BMD density of $5 \times 10^7$ defects/cm$^3$ or more.

2. The p-type annealed silicon wafer according to claim 1, wherein the heat treatment is carried out in an argon gas ambient atmosphere at a temperature of 1100 to 1300° C.

3. The p-type annealed silicon wafer according to claim 2, wherein the heat treatment is carried out for approximately 1 hour.

4. The p-type annealed silicon wafer according to claim 1, wherein the resistivity in the depth direction from the surface to the bulk layer is uniform.

5. The p-type annealed silicon wafer according to claim 1, wherein the p-type silicon wafer has COP-free surface.

6. The p-type annealed silicon wafer according to claim 1, wherein the heat treatment comprises:

loading p-type silicon wafers having a resistivity of 10 Ω·cm or more onto a wafer boat, inserting the loaded wafer boat into a vertical furnace, and holding the p-type silicon wafers in an argon gas ambient atmosphere at a temperature of 1100 to 1300° C.; moving the wafer boat to a transfer chamber and discharging the heat-treated p-type silicon wafers from the wafer boat; and transferring to the wafer boat p-type silicon wafers to be heat treated next, and defining a length of time from a time when the heat treated p-type silicon wafers are discharged from the wafer boat in the transfer chamber to a time when the p-type silicon wafers to be heat treated next are transferred to the wafer boat as a waiting time during which the wafer boat waits in the transfer chamber, the waiting time is set to be less than two hours.

* * * * *